United States Patent
Renau et al.

(10) Patent No.: US 6,573,518 B1
(45) Date of Patent: Jun. 3, 2003

(54) BI MODE ION IMPLANTATION WITH NON-PARALLEL ION BEAMS

(75) Inventors: Anthony Renau, West Newbury, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 250 days.

(21) Appl. No.: 09/699,653

(22) Filed: Oct. 30, 2000

(51) Int. Cl.⁷ .............................................. H01J 37/317
(52) U.S. Cl. ............................. 250/492.21; 250/442.11
(58) Field of Search ...................... 250/492.21, 492.2, 250/442.11

(56) References Cited

U.S. PATENT DOCUMENTS

| | | | |
|---|---|---|---|
| 4,922,106 A | 5/1990 | Berrian et al. | 250/492.2 |
| 5,180,918 A | 1/1993 | Isobe | |
| 5,350,926 A | 9/1994 | White et al. | 250/492.21 |
| 5,422,490 A * | 6/1995 | Nakamura et al. | 250/492.21 |
| 5,641,969 A | 6/1997 | Cooke et al. | |
| 6,163,033 A | 12/2000 | Smick et al. | |
| 6,437,350 B1 * | 8/2002 | Olson et al. | 250/492.21 |

FOREIGN PATENT DOCUMENTS

JP 3-017949 1/1991

OTHER PUBLICATIONS

J.C. Olson and A. Renau, "Control of Channeling Uniformity for Advanced Applications", 2000 International Conference on Ion Implantation Technology Proceedings. Ion Implantation Technology—2000, Alpbach, AUS, pp. 670–673.

* cited by examiner

Primary Examiner—Jack Berman (57) ABSTRACT

A method for implanting ions into a workpiece, such as a semiconductor wafer, includes the steps of generating an ion beam, measuring an angle of non-parallelism of the ion beam, tilting the wafer at a first angle, performing a first implant at the first angle, tilting the wafer at a second angle, and performing a second implant at the second angle. The first and second angles are opposite in sign with respect to a reference direction and in magnitude are equal to or greater than the measured angle of non-parallelism. Preferably, the first and second implants are controlled to provide substantially equal ion doses in the workpiece.

28 Claims, 7 Drawing Sheets

|  | L | C | R |
|---|---|---|---|
| FIRST BI MODE IMPLANT | 2 | 1 | 0 |
| SECOND BI MODE IMPLANT | 0 | -1 | -2 |
| BI MODE AVERAGE | 1 | 1 | 1 |
|  |  |  |  |

BI MODE ION IMPLANTATION WITH NON-PARALLEL ION BEAMS

FIELD OF THE INVENTION

This invention relates to systems and methods for ion implantation of semiconductor wafers or other workpieces and, more particularly, to methods and apparatus for achieving uniform ion implantation over the surface of a semiconductor wafer with non-parallel ion beams.

BACKGROUND OF THE INVENTION

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement. An ion implanter which utilizes a combination of beam scanning and target movement is disclosed in U.S. Pat. No. 4,922,106 issued May 1, 1990 to Berrian et al.

The delivery of a parallel ion beam to the semiconductor wafer is an important requirement in many applications. A parallel ion beam is one which has parallel ion trajectories over the surface of the semiconductor wafer. In cases where the ion beam is scanned, the scanned beam is required to maintain parallelism over the wafer surface. The parallel ion beam prevents channeling of incident ions in the crystal structure of the semiconductor wafer or permits uniform channeling in cases where channeling is desired. Typically, a serial ion implanter is utilized when a high degree of beam parallelism is required.

In one approach, the beam is scanned in one dimension so that it appears to diverge from a point, referred to as the scan origin. The scanned beam is then passed through an ion optical element which performs focusing. The ion optical element converts the diverging ion trajectories to parallel ion trajectories for delivery to the semiconductor wafer. Focusing can be performed with an angle corrector magnet or with an electrostatic lens. The angle correction magnet produces both bending and focusing of the scanned ion beam. Parallelism may be achieved with an electrostatic lens, but energy contamination can be a drawback.

The output ion beam from the angle corrector magnet or other focusing element may be parallel or may be converging or diverging, depending on the parameters of the ion beam and the parameters of the focusing element. When an angle corrector magnet is utilized, parallelism can be adjusted by varying the magnetic field of the angle corrector magnet. The angle corrector magnet typically has a single magnetic field adjustment which varies both parallelism and bend angle, or beam direction. It will be understood that the ion implanter is often required to run a variety of different ion species and ion energies. When the beam parameters are changed, readjustment of the angle corrector magnet is required to restore beam parallelism.

The requirement for readjustment of beam parallelism adds complexity and delay to ion implanter operation. Furthermore, the angle corrector magnet or other ion optical element used to produce a parallel ion beam adds to the cost of the ion implanter and increases the length of the ion implanter beamline.

Accordingly, there is a need for ion implantation methods and apparatus in which the requirement for beam parallelism is relaxed, without degrading ion implantation uniformity over the surface of the semiconductor wafer.

SUMMARY OF THE INVENTION

According to a first aspect of the invention, a method is provided for implanting ions into a workpiece. The method comprises the steps of generating an ion beam, measuring an angle of non-parallelism of the ion beam, performing a first implant with the workpiece oriented at a first angle, and performing a second implant with the workpiece oriented at a second angle. The first and second angles are opposite in sign with respect to a reference direction and in magnitude are equal to or greater than the measured angle of non-parallelism.

In one embodiment, the reference direction comprises the direction of the ion beam at the workpiece. In another embodiment, the reference direction comprises a selected implant angle relative to the direction of the ion beam at the workpiece.

Preferably, the first and second implants are controlled to provide substantially equal ion doses in the workpiece. The workpiece may comprise a semiconductor wafer. In one preferred embodiment, the first and second angles are equal in magnitude to the measured angle of non-parallelism.

In a first embodiment, the ion beam is generated utilizing a parallelizing device. In a second embodiment, the ion beam is generated without utilizing a parallelizing device.

According to another aspect of the invention, a method is provided for implanting ions into a semiconductor wafer. The method comprises the steps of generating an ion beam, measuring an angle of non-parallelism of the ion beam, tilting the wafer at a first angle, performing a first implant at the first angle, tilting the wafer at a second angle, and performing a second implant at the second angle. The first and second angles are opposite in sign with respect to a reference direction and in magnitude are equal to or greater than the measured angle of non-parallelism.

According to a further aspect of the invention, apparatus is provided for implanting ions into a semiconductor wafer. The apparatus comprises means for generating an ion beam, means for measuring an angle of non-parallelism of the ion beam, means for tilting the wafer at a first angle, means for performing a first implant at the first angle, means for tilting the wafer at a second angle, and means for performing a second implant at the second angle. The first and second angles are opposite in sign with respect to a reference direction and in magnitude are equal to or greater than the measured angle of non-parallelism.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
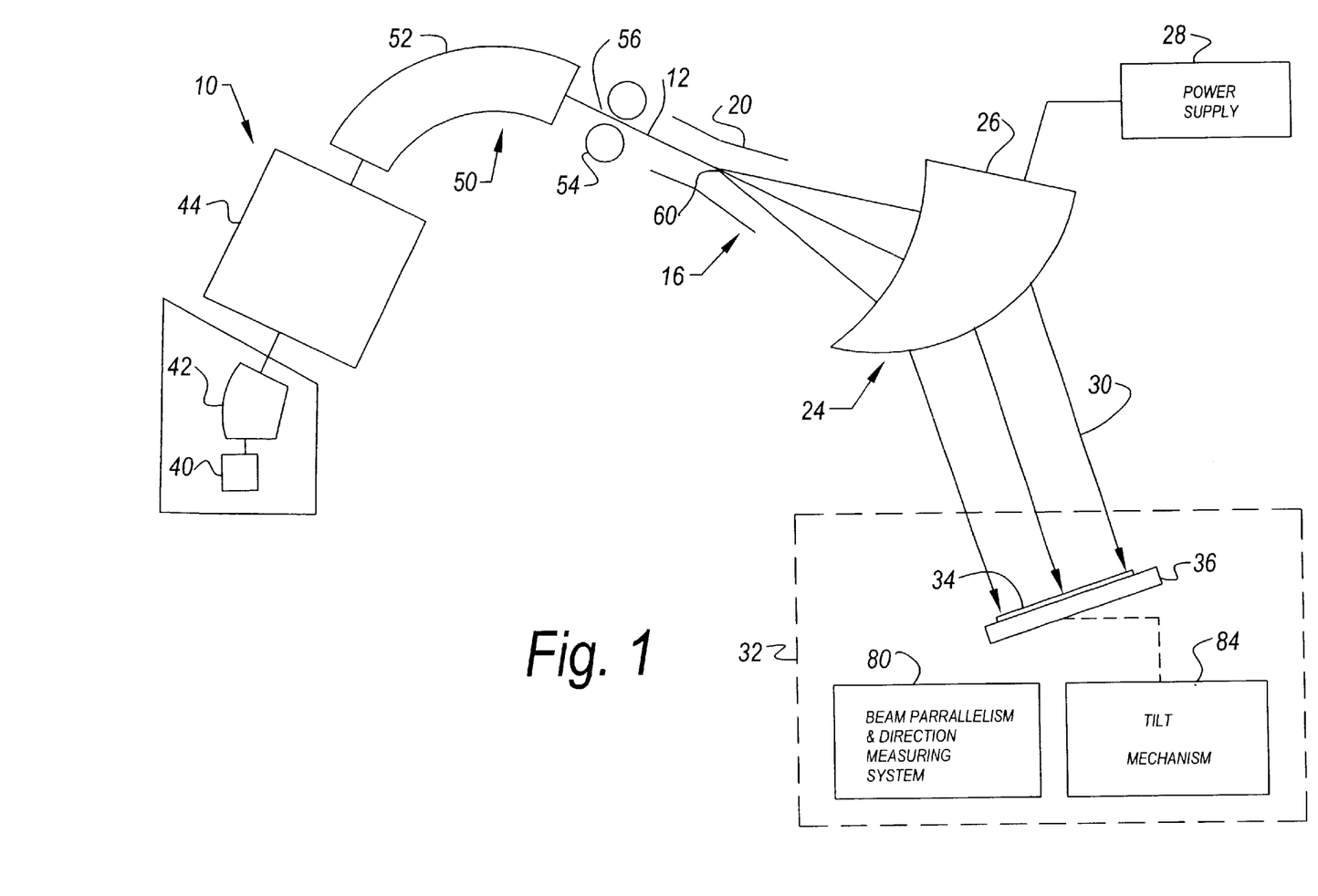
FIG. 1 is a schematic diagram of an ion implanter suitable for implementing the present invention.

A simplified block diagram of an example of an ion implanter suitable for incorporating the present invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12 having low level of energy and mass contaminants. A scanning system 16, which includes a scanner 20 and an angle corrector 24, deflects the ion beam 12 to produce a scanned ion beam 30 having parallel or nearly parallel ion trajectories. An end station 32 includes a platen 36 that supports a semiconductor wafer 34 or other workpiece in the path of scanned ion beam 30 such that ions of the desired species are implanted into the semiconductor wafer 34. The ion implanter may include additional components well known to those skilled in the art. For example, the end station 32 typically includes automated wafer handling equipment for introducing wafers into the ion implanter and for removing wafers after implantation, a dose measuring system, an electron flood gun, etc. It will be understood that the entire path traversed by the ion beam is evacuated during ion implantation.

The principal components of ion beam generator 10 include an ion beam source 40, a source filter 42, an acceleration/deceleration column 44 and a mass analyzer 50. The source filter 42 is preferably positioned in close proximity to ion beam source 40. The acceleration/deceleration column 44 is positioned between source filter 42 and mass analyzer 50. The mass analyzer 50 includes a dipole analyzing magnet 52 and a mask 54 having a resolving aperture 56.

The scanner 20, which may be an electrostatic scanner, deflects ion beam 12 to produce a scanned ion beam having ion trajectories which diverge from a scan origin 60. The scanner 20 may comprise spaced-apart scan plates connected to a scan generator. The scan generator applies a scan voltage waveform, such as a sawtooth waveform, for scanning the ion beam in accordance with the electric field between the scan plates.

Angle corrector 24 is designed to deflect ions in the scanned ion beam to produce scanned ion beam 30 having parallel ion trajectories. In particular, angle corrector 24 may comprise magnetic pole pieces 26 which are spaced apart to define a gap and a magnet coil (not shown) which is coupled to a power supply 28. The scanned ion beam passes through the gap between the pole pieces 26 and is deflected in accordance with the magnetic field in the gap. The magnetic field may be adjusted by varying the current through the magnet coil. Beam scanning and beam focusing are performed in a selected plane, such as a horizontal plane.

In the embodiment of FIG. 1, end station 32 includes a beam parallelism and direction measuring system 80. System 80 measures beam parallelism and direction as described below. In addition, end station 32 includes a tilt mechanism 84 for tilting wafer support platen 36 with respect to the scanned ion beam 30. In one embodiment, tilt mechanism 84 may tilt wafer support platen 36 with respect to two orthogonal axes.

Figure 2:
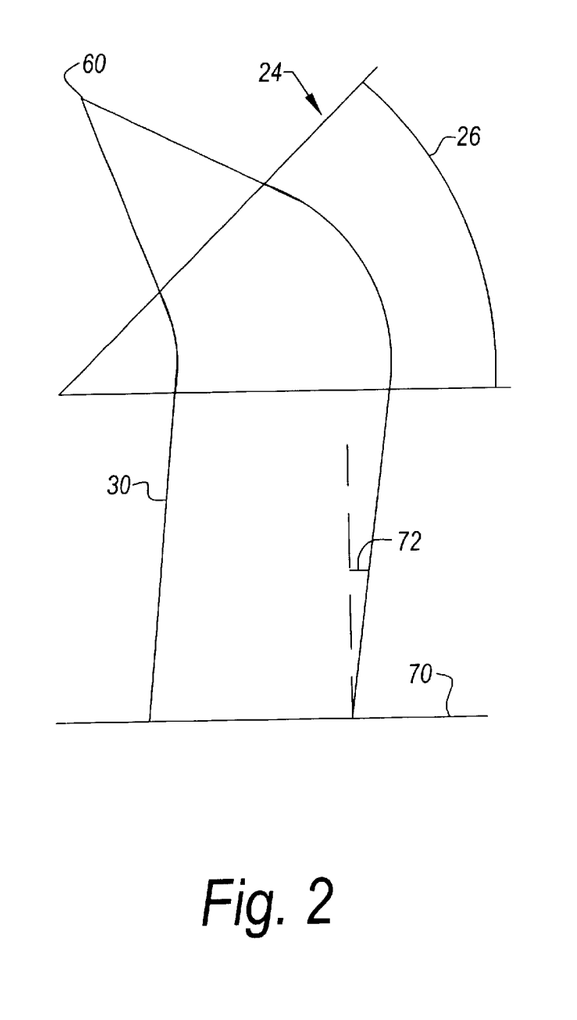
FIG. 2 is a schematic diagram that illustrates the operation of an angle corrector magnet for the case of a relatively large bend angle and converging ion trajectories.
Figure 3:
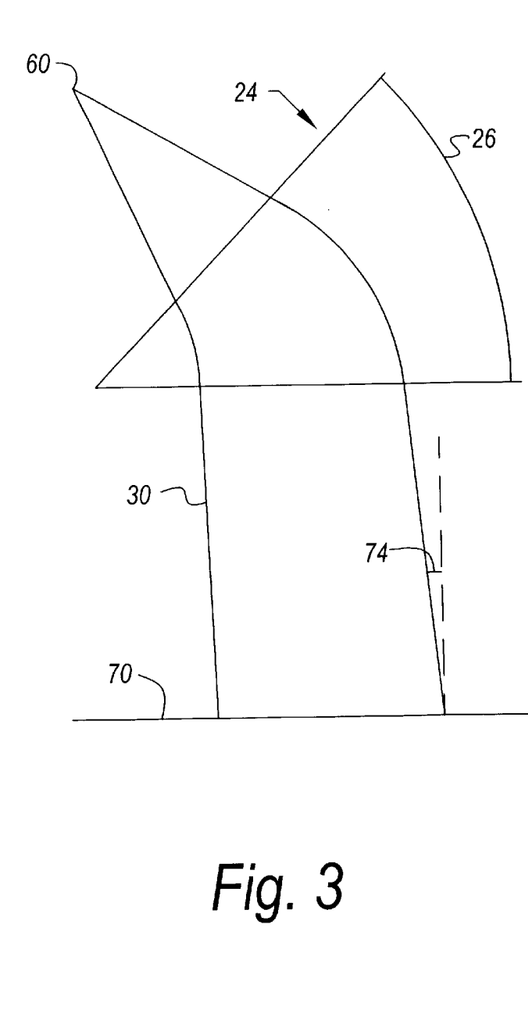
FIG. 3 is a schematic diagram that illustrates the operation of an angle corrector magnet for the case of a relatively small bend angle and diverging ion trajectories.

Examples of operation of angle corrector 24 are shown in FIGS. 2 and 3. As shown, the pole pieces 26 of angle corrector 24 may be wedged shaped or similarly shaped so that different ion trajectories have different path lengths through the gap between the pole pieces. In FIG. 2, a relatively high intensity magnetic field is applied. The ion trajectories have a relatively large bend angle and may be converging as they exit from angle corrector 24. In the example of FIG. 3, a relatively low intensity magnetic field is applied. The ion trajectories have a relatively small bend angle and may be diverging as they exit from angle corrector 24. Thus, scanned ion beam 30 is incident on a wafer plane 70 at a positive angle 72 with respect to a normal to wafer plane 70 in the example of FIG. 2 and is incident on wafer plane 70 at a negative angle 74 with respect to a normal to wafer plane 70 in the example of FIG. 3. It will be understood that parallel or nearly parallel ion trajectories can be produced by appropriate adjustment of the magnetic field in angle corrector 24. However in general, the magnetic field that provides the best parallelism does not necessarily result in normal incidence of scanned ion beam 30 on wafer plane 70.

Figure 4:
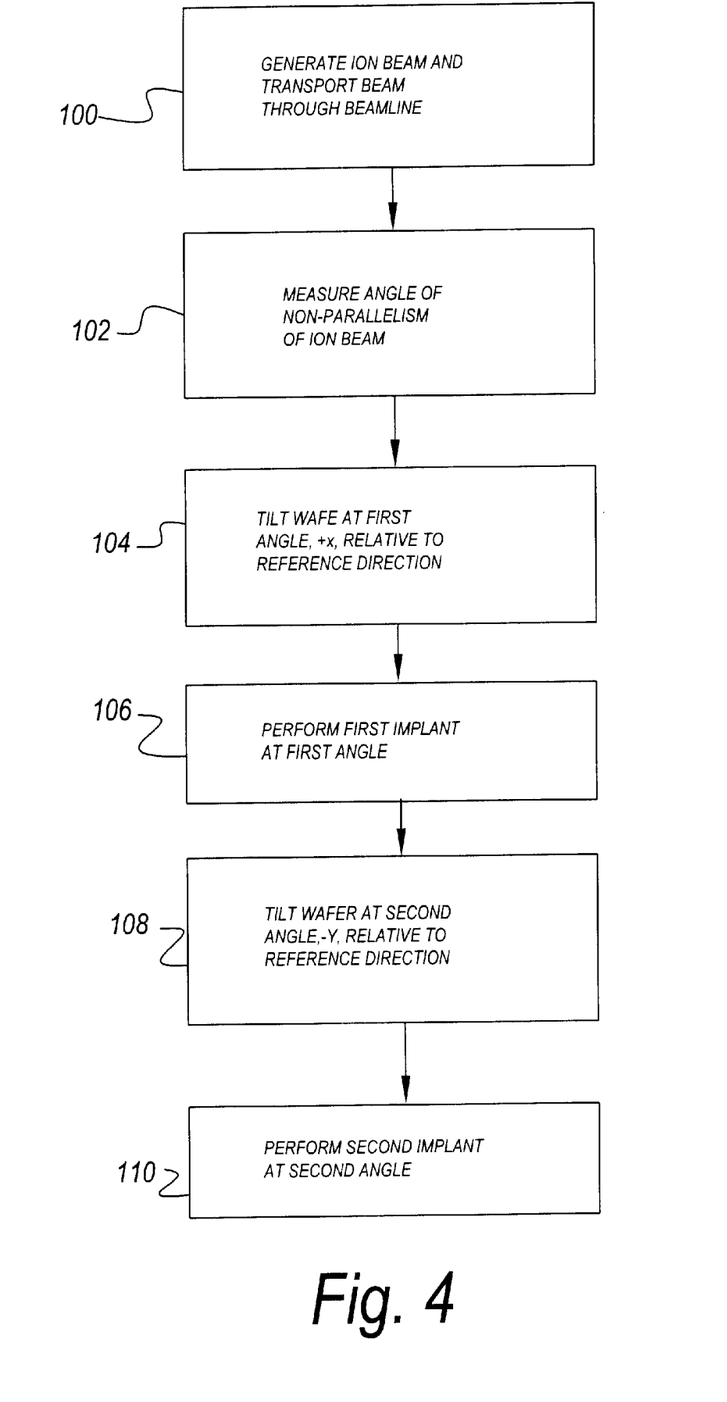
FIG. 4 is a flow chart of an ion implantation process in accordance with an embodiment of the invention.

A flow chart of a process for implanting ions into a workpiece in accordance with an embodiment of the invention is shown in FIG. 4. In step 100, an ion beam is generated and is transported through the beamline of an ion implanter. As shown in FIG. 1, ion beam 12 is generated by ion beam generator 12 and is transported through scanner and angle corrector 24 to end station 32.

Figure 5:
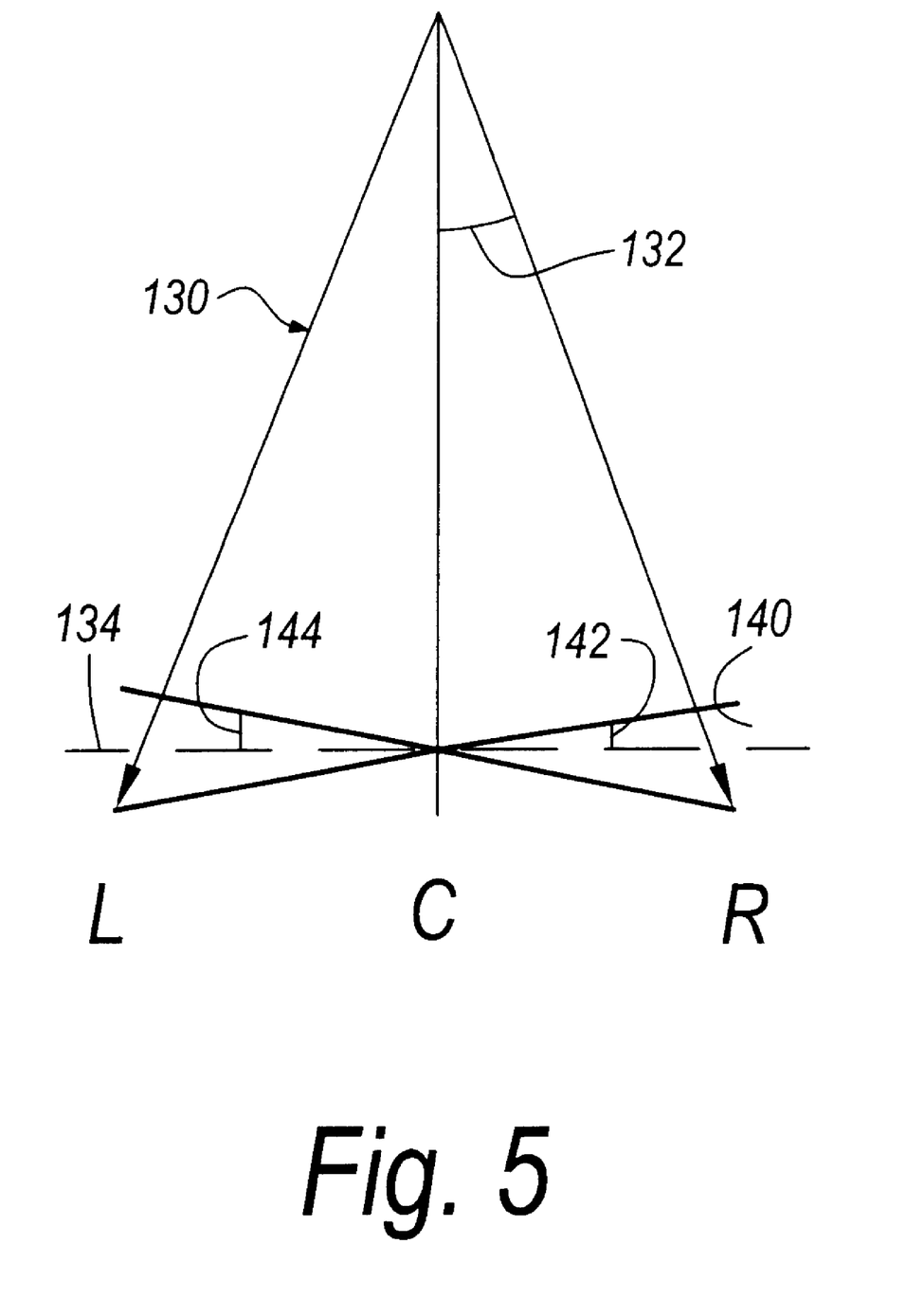
FIG. 5 is a schematic diagram that illustrates bi-mode ion implantation in accordance with an embodiment of the invention.

In step 102, the parallelism of the ion beam is measured at or near the plane where the ion beam is incident on the semiconductor wafer or other workpiece. The parallelism measurement provides an angle of non-parallelism of the ion beam and, in particular, typically provides a half angle of convergence or divergence of the ion beam. The measured angle of non-parallelism represents the maximum excursion of the ion beam trajectories from the center ray of the ion beam. An example of a technique for measuring ion beam parallelism is described below in connection with FIGS. 7A, 7B, 8A and 8B. A non-parallel ion beam 130 having a half angle 132 of divergence is shown in FIG. 5. The amount of divergence of ion beam 130 is exaggerated in FIG. 5 for purposes of illustration. Beam parallelism is measured in the plane of scanning and focusing of the ion beam.

Referring again to FIG. 4, the wafer is tilted at a first bi-mode angle, +x, relative to a reference direction in step 104. As shown in FIG. 1, tilt mechanism 84 is used to tilt wafer support platen 36 relative to scanned ion beam 30. The first bi-mode angle is defined below. In step 106, a first implant is performed with the wafer 140 tilted at the first bi-mode angle. In step 108, the wafer is tilted at a second bi-mode angle, −y, relative to the reference direction, as defined below. In step 110, a second implant is performed 110 with the wafer tilted at the second bi-mode angle. Preferably, the first implant of step 106 and the second implant of step 110 have equal energies and doses to ensure implant uniformity over the surface of the semiconductor wafer.

The first bi-mode angle +x and the second bi-mode angle −y are opposite in sign relative to a reference direction and in magnitude are equal to or greater than the measured angle of non-parallelism. In describing the reference direction, it is useful to consider the so-called "implant angle", which is the angle between the incident ion beam and a normal to the wafer surface. The implant angle, which is typically in a range of 0° to 7°, is used to control channeling of the energetic ions in the crystalline lattice of the semiconductor wafer.

In the simple case where the implant angle is 0°, the reference direction for the first and second bi-mode angles is the direction of the ion beam. In this case, the wafer is tilted by bi-mode angles of opposite sign relative to the incident ion beam, as shown in FIG. 5. Wafer 140 is tilted by a first bi-mode angle 142 relative to wafer plane 134 for the first implant and is tilted by a second bi-mode angle 144 relative to wafer plane 134 for the second implant. Angles 142 and 144 are opposite in sign relative to wafer plane 134 and in magnitude are equal to or greater than the measured angle 132 of non-parallelism of ion beam 130. Preferably, angles 142 and 144 are as close in magnitude as is practical to the measured angle of non-parallelism. In a preferred embodiment, angles 142 and 144 are equal in magnitude to the measured angle of non-parallelism. In general however, angles 142 and 144 are not required to have equal magnitudes.

A non-zero implant angle may be set by tilting the wafer in a direction parallel to the plane of scanning and focusing, i.e., the plane of FIG. 5, or may be set by tilting the wafer in a direction orthogonal to the plane of scanning and focusing. Where the non-zero implant angle is set by tilting the wafer in a direction orthogonal to the plane of scanning and focusing, the reference direction for the first and second angles is the direction of the ion beam, as illustrated in FIG. 5 and described above. Where the non-zero implant angle is set by tilting the wafer in a direction parallel to the plane of scanning and focusing, the reference direction is normal to a wafer tilted at the selected implant angle. In this case, the first implant is performed at the first bi-mode angle relative to the selected implant angle and the second implant is performed at the second bi-mode angle relative to the selected implant angle. In the case where the first and second bi-mode angles are equal in magnitude to the measured angle of non-parallelism, the first implant is performed at the selected implant angle plus the measured angle of non-parallelism, and the second implant is performed at the selected implant angle minus the measured angle of non-parallelism. For example, assume a selected implant angle of 7° and a measured angle of non-parallelism of 1°. In this example, the first bi-mode implant (step 106) is performed at a tilt angle of 7°+1°=8°, and the second bi-mode implant (step 110) is performed at a tilt angle of 7°−1°=6°. It will be understood that this approach can be utilized with any selected implant angle and bi-mode angles. Furthermore, the order of the first and second implants can be reversed.

Figure 6:
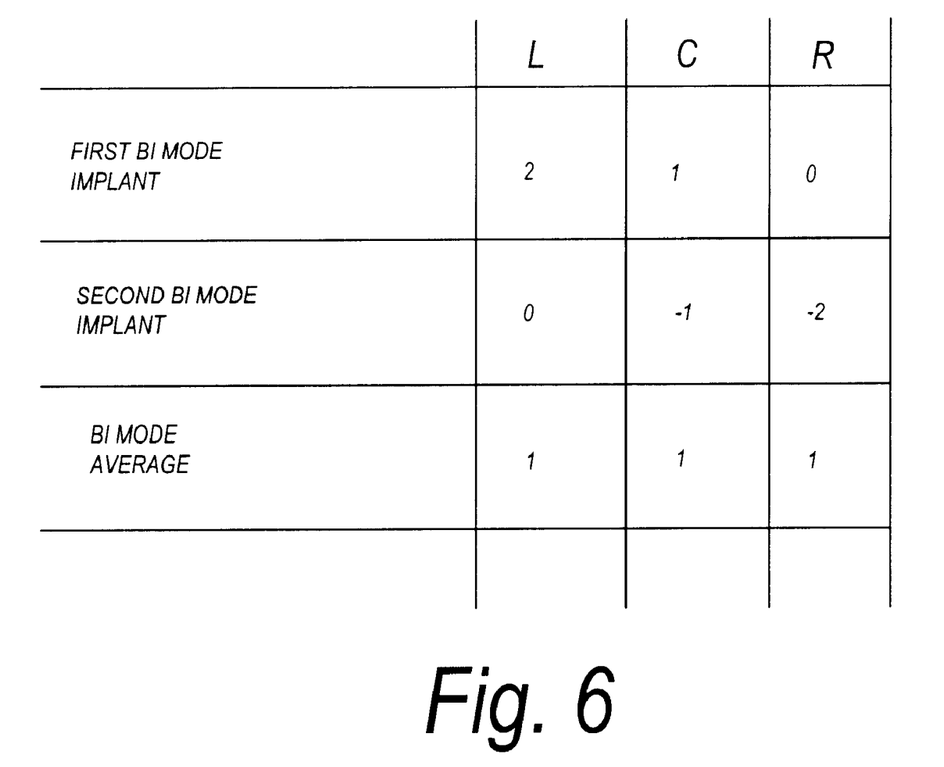
FIG. 6 is a table that illustrates an example of the uniformity of implant angle obtained with bi-mode ion implantation.

The averaging effect of a bi-mode implant in accordance with the present invention is described with reference to FIG. 6. In the example of FIG. 6, the desired implant angle is zero degrees, and the non-parallel ion beam is assumed to have a measured angle of non-parallelism of 1°. In a first bi-mode implant, wafer 140 in FIG. 5 is tilted by first bi-mode angle 142 of 1° with respect to wafer plane 134. With this tilt angle, the left side of wafer 140 is implanted at an angle of 2°, the center of wafer 140 is implanted at an angle of 1° and the right side of wafer 140 is implanted at an angle of 0°, as summarized in FIG. 6. In a second bi-mode implant, wafer 140 is tilted by second bi-mode angle 144 of −1° with respect to wafer plane 134. With this tilt angle, the left side of wafer 140 is implanted at an angle of 0°, the center of wafer 140 is implanted at an angle of −1° and the right side of wafer 140 is implanted at an angle of −2°, as summarized in FIG. 6. As further illustrated in FIG. 6, the average of the two implants is a uniform angle of 1° across the wafer surface. The determination of the average of the first and second bi-mode implants is based on the assumption that implants at positive and negative angles of equal magnitude are equivalent.

Figure 9:
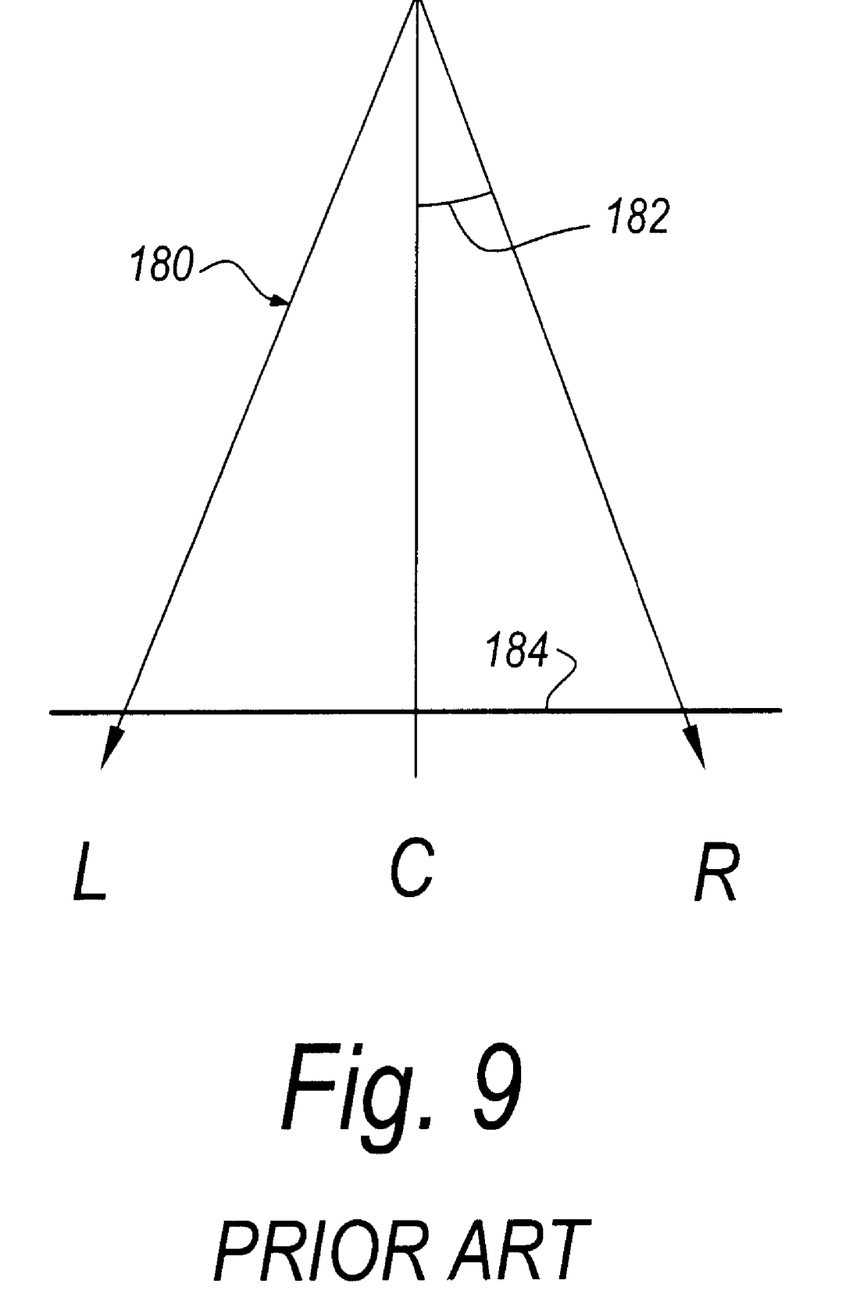
FIG. 9 is a schematic diagram that illustrates prior art ion implantation with a non-parallel ion beam.

A prior art single mode implant using a non-parallel ion beam is illustrated schematically in FIG. 9. A non-parallel ion beam 180 having an angle of non-parallelism 182 is used to implant a wafer 184 with normal incidence. The prior art implant technique shown in FIG. 9 results in a variation in incident angle of the ion beam over the wafer surface. In particular, for an ion beam having an angle of non-parallelism of 1°, the beam has an incident angle of +1° at the left side of the wafer, an incident angle of 0° at the center of the wafer and an incident angle of −1° at the right side of the wafer. Thus, the angle of incidence varies by 1° over the wafer surface. In some applications, such variation in angle of incidence may be unacceptable.

Figure 7A:
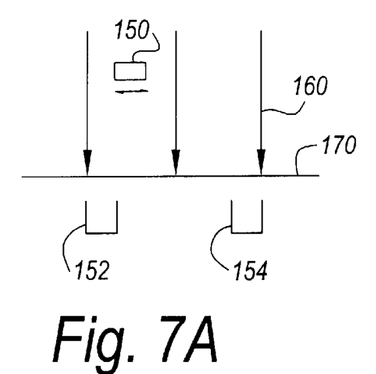
FIGS. 7A and 7B are schematic diagrams that illustrate operation of an example of a device for measuring beam parallelism.
Figure 7B:
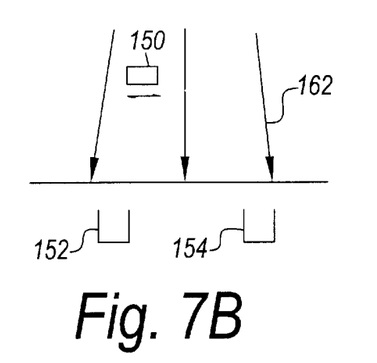
Figure 8A:
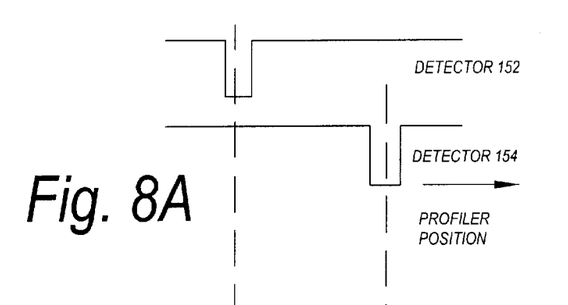
FIGS. 8A and 8B are graphs of beam detector output as a function of beam profiler position for the beam conditions illustrated in FIGS. 6A and 6B, respectively.
Figure 8B:
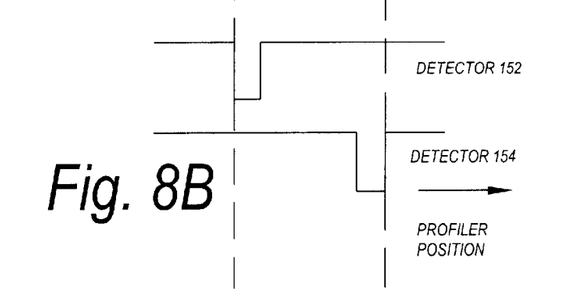

An example of a technique for measuring ion beam parallelism is described with reference to FIGS. 7A, 7B, 8A, and 8B. FIGS. 7A and 7B are schematic diagrams which illustrate the measurement of different ion beams with a beam profiler and two beam detectors. FIGS. 8A and 8B are graphs that illustrate the outputs of the beam detectors as a function of profiler position.

As shown in FIGS. 7A and 7B, ion beam parallelism is measured using a moving beam profiler 150 and spaced-apart beam detectors 152 and 154, which correspond to beam parallelism and direction measuring system 80 (FIG. 1). Beam profiler 150 may be any element that partially blocks the ion beam and is laterally movable relative to the ion beam. Detectors 152 and 154, for example, may be Faraday cups, which produce an electrical output signal in response to an incident ion beam. As the profiler 150 is moved across the ion beam, it blocks a portion of the ion beam and produces an ion beam shadow. The beam shadow moves across detectors 152 and 154 and produces output signals in the form of negative going output current pulses.

As shown in FIG. 7A, a parallel scanned ion beam 160 has normal incidence on a wafer plane 170. Detectors 152 and 154 produce output pulses as shown in FIG. 8A when the profiler is positioned in alignment with each detector. The profiler positions at which detector output pulses are generated can be used to determine that ion beam 160 has parallel trajectories and is normal to wafer plane 170.

Referring to FIG. 7B, a diverging ion beam 162 has normal incidence on wafer plane 170. In this case, detector 152 produces an output pulse as shown in FIG. 8B when profiler 150 is positioned to the right of detector 152, and detector 154 produces an output pulse when profiler 150 is positioned to the left of detector 154. The profiler positions at which output pulses are generated can be used to determine the angle of divergence of ion beam 162. In response to a converging ion beam (not shown), detector 152 produces an output pulse when profiler is positioned to the left of detector 152, and detector 154 produces an output pulse when profiler 150 is positioned to the right of detector 154. The profiler positions at which detector output pulses are generated can be used to determine the angle of convergence of the ion beam. Additional details regarding techniques for measuring ion beam parallelism are provided in U.S. application Ser. No. 09/588,419, filed Jun. 6, 2000, which is hereby incorporated by reference.

It will be understood that different techniques may be used for measuring beam parallelism within the scope of the invention. In addition, the invention is not limited to use with a scanned ion beam. For example, the invention may be used with a ribbon ion beam as disclosed in U.S. Pat. No. 5,350,926, issued Sep. 27, 1994 to White et al.

The bi-mode implant technique described above permits the specification on beam parallelism to be relaxed without degrading ion implantation uniformity over the surface of the semiconductor wafer. Depending on the architecture of the ion implanter, ion implantation uniformity may be achieved without requiring an ion optical element to for parallelizing the ion beam. In ion implanter architectures which include an ion optical element for parallelizing the ion beam, the requirement for adjusting the parallelism of the ion beam may be relaxed, in some cases permitting a fixed parallelizing ion optical element to be used.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for implanting ions into a workpiece, comprising the steps of:
    generating an ion beam;
    measuring an angle of non-parallelism of the ion beam;
    performing a first implant with the workpiece oriented at a first angle; and
    performing a second implant with the workpiece oriented at a second angle, wherein the first and second angles are opposite in sign with respect to a reference direction and in magnitude are equal to or greater than the measured angle of non-parallelism.

2. A method as defined in claim 1 wherein the steps of performing said first and second implants are controlled to provide substantially equal ion doses in the workpiece.

3. A method as defined in claim 1 wherein the angle of non-parallelism is less than about 5°.

4. A method as defined in claim 1 wherein the angle of non-parallelism comprises a half angle of divergence of the ion beam.

5. A method as defined in claim 1 wherein the angle of non-parallelism comprises a half angle of convergence of the ion beam.

6. A method as defined in claim 1 further comprising the step of generating the ion beam utilizing a parallelizing device.

7. A method as defined in claim 1 further comprising the step of generating the ion beam without utilizing a parallelizing device.

8. A method as defined in claim 1 wherein the reference direction comprises a direction of the ion beam at the workpiece.

9. A method as defined in claim 1 wherein the reference direction comprises a selected implant angle relative to a direction of the ion beam at the workpiece.

10. A method as defined in claim 1 wherein the first and second angles are equal in magnitude.

11. A method for implanting ions into a semiconductor wafer, comprising the steps of:
    generating an in beam;
    measuring an angle of non-parallelism of the ion beam;
    tilting the wafer at a first angle;
    performing a first implant at the first angle;
    tilting the wafer at a second angle; and
    performing a second implant at the second angle, wherein the first and second angles are opposite in sign with respect to a reference direction and in magnitude are equal to or greater than the measured angle of non-parallelism.

12. A method as defined in claim 11 wherein said first and second implants are controlled to provide substantially equal ion doses in the wafer.

13. A method as defined in claim 11 wherein the angle of non-parallelism of the ion beam is less than about 5°.

14. A method as defined in claim 11 wherein the angle of non-parallelism of the ion beam comprises a half angle of divergence of the ion beam.

15. A method as defined in claim 11 wherein the angle of non-parallelism of the ion beam comprises a half angle of convergence of the ion beam.

16. A method as defined in claim 11 further comprising the step of generating the ion beam utilizing a parallelizing device.

17. A method as defined in claim 11 further comprising the step of generating the ion beam without utilizing a parallelizing device.

18. A method as defined in claim 11 wherein the reference direction comprises a direction of the ion beam at the wafer.

19. A method as defined in claim 11 wherein the reference direction comprises a selected implant angle relative to a direction of the ion beam at the wafer.

20. A method as defined in claim 11 wherein the first and second angles are equal in magnitude.

21. Apparatus for implanting ions into a semiconductor wafer, comprising:
    means for generating an ion beam;
    means for measuring an angle of non-parallelism of the ion beam;
    means for tilting the wafer at a first angle;
    means for performing a first implant at the first angle;
    means for tilting the wafer at a second angle; and
    means for performing a second implant at the second angle, wherein the first and second angles are opposite in sign with respect to a reference direction and in magnitude are equal to or greater than the measured angle of non-parallelism.

22. A method for implanting ions into a semiconductor wafer, comprising the steps of:
    generating an ion beam;
    tilting the wafer at a first angle with respect to the ion beam;
    performing a first implant with the wafer tilted at the first angle;
    tilting the wafer at a second angle that is equal in magnitude and opposite in sign with respect to said first angle; and
    performing a second implant with the wafer tilted at the second angle.

23. A method as defined in claim 22 wherein the step of tilting the wafer at a first angle comprises tilting the wafer at a half angle of divergence of the ion beam.

24. A method as defined in claim 22 wherein the step of tilting the wafer at a first angle comprises tilting the wafer at a half angle of convergence of the ion beam.

25. Apparatus for implanting ions into a semiconductor wafer, comprising:
   an ion beam generator;
   a measuring system for measuring an angle of non-parallelism of the ion beam; and
   a tilt mechanism for tilting the semiconductor wafer at first and second angles, wherein the first and second angles are opposite in sign with respect to a reference direction and in magnitude are equal to or greater than the measured angle of non-parallelism, wherein first and second implants are performed at the first and second angles, respectively.

26. Apparatus as defined in claim 25 wherein said measuring system comprises a movable beam profiler and one or more beam detectors.

27. Apparatus as defined in claim 25 further comprising an ion optical element for parallelizing the ion beam.

28. Apparatus as defined in claim 25 wherein the first and second angles are equal in magnitude.

* * * * *